(12) United States Patent
Jeong (10) Patent No.: US 7,602,110 B2
(45) Date of Patent: Oct. 13, 2009

(54) HEAT DISSIPATION UNIT FOR A PLASMA DISPLAY APPARATUS

(75) Inventor: Kwang-Jin Jeong, Suwon-si (KR)

(73) Assignee: Samsung SDI Co., Ltd., Suwon-si, Gyeonggi-do (KR)

( * ) Notice: Subject to any disclaimer, the term of this patent is extended or adjusted under 35 U.S.C. 154(b) by 59 days.

(21) Appl. No.: 11/365,930

(22) Filed: Mar. 2, 2006

(65) Prior Publication Data
US 2006/0214583 A1   Sep. 28, 2006

(30) Foreign Application Priority Data
Mar. 23, 2005   (KR)   .................. 10-2005-0024024

(51) Int. Cl.
*H01K 1/58*   (2006.01)
(52) U.S. Cl. .................. 313/46; 313/582; 361/704
(58) Field of Classification Search .................. None
See application file for complete search history.

(56) References Cited

U.S. PATENT DOCUMENTS

| 4,673,842 | A | * | 6/1987 | Grieger et al. | ............. | 313/292 |
|---|---|---|---|---|---|---|
| 5,831,374 | A | * | 11/1998 | Morita et al. | .................. | 313/46 |
| 5,971,566 | A | * | 10/1999 | Tani et al. | .................. | 362/294 |
| 7,160,619 | B2 | * | 1/2007 | Clovesko et al. | ............. | 428/408 |
| 7,306,847 | B2 | * | 12/2007 | Capp et al. | .................. | 428/408 |
| 7,468,582 | B2 | | 12/2008 | Kim et al. | | |
| 2005/0068738 | A1 | * | 3/2005 | Kim et al. | .................. | 361/704 |
| 2005/0258749 | A1 | * | 11/2005 | Ahn | ............. | 313/582 |
| 2006/0087233 | A1 | * | 4/2006 | Kim et al. | .................. | 313/582 |
| 2006/0152905 | A1 | * | 7/2006 | Kim et al. | .................. | 361/715 |
| 2006/0219161 | A1 | * | 10/2006 | Wakamatsu et al. | ......... | 117/200 |

FOREIGN PATENT DOCUMENTS

| JP | H04-071236 | 6/1992 |
|---|---|---|
| JP | H06-134917 | 5/1994 |
| JP | H09-199040 | 7/1997 |
| JP | H10-040823 | 2/1998 |
| JP | H10-330177 | 12/1998 |
| JP | 2001-022281 | 1/2001 |
| JP | 2004-152895 | 5/2004 |
| WO | WO 2005/016820 | 2/2005 |

OTHER PUBLICATIONS

Japanese Office Action dated Jan. 6, 2009 in applicant's corresponding Janpanese Application No. 2006-034188.

* cited by examiner

*Primary Examiner*—Toan Ton
*Assistant Examiner*—Britt Hanley
(74) *Attorney, Agent, or Firm*—Robert E. Bushnell, Esq.

(57) ABSTRACT

A plasma display apparatus that includes a plasma display panel adapted to display an image, a chassis base arranged at a rear of the plasma display panel, a circuit unit arranged on the chassis base and adapted to drive the plasma display panel and a heat dissipation unit arranged between the plasma display panel and the chassis base, the heat dissipation unit comprising a first heat dissipation element comprised of a material that produces debris, a first heat dissipation element arranged parallel to both the plasma display panel and the chassis base and adapted to dissipate heat generated by the plasma display panel and a second heat dissipation element covering at least a portion of the first heat dissipation element and being adapted to prevent debris from being released from the first heat dissipation element.

20 Claims, 6 Drawing Sheets

FRONT ← → BACK

FRONT ← → BACK

HEAT DISSIPATION UNIT FOR A PLASMA DISPLAY APPARATUS

CLAIM OF PRIORITY

This application makes reference to, and incorporates the same herein, and claims all benefits accruing under 35 U.S.C. § 119 from an application for PLASMA DISPLAY APPARATUS earlier filed in the Korean Intellectual Property Office on 23 Mar. 2005 and there duly assigned Serial No. 10-2005-0024024.

BACKGROUND OF THE INVENTION

1. Field of the Invention

A plasma display apparatus having a heat dissipation unit that has an improved structure and that dissipates heat generated by a plasma display panel.

2. Description of the Related Art

Typically, a plasma display apparatus is a flat display apparatus that displays an image using a gas discharge phenomenon. The plasma display apparatus is superior in various display characteristics, such as a display capacity, a luminance, a contrast, image retention, and viewing angle. The plasma display apparatus can be made to have a large screen size while being thin. As a result, the plasma display apparatus is spotlighted as a next-generation display apparatus that can replace cathode ray tubes (CRTs).

A plasma display apparatus includes a plasma display panel (PDP) that displays an image, a chassis base arranged parallel to the PDP, circuit units installed on a rear surface of the chassis base to drive the PDP, and a case that accommodates the PDP, the chassis base, and the circuit units. Gas discharge occurs in the PDP so that the PDP can display an image.

Displaying the image on a plasma display apparatus leads to the generation of a large amount of heat. Such heat degrades the display performance of the PDP and results in a degradation in the reliability of the circuit units when the plasma display apparatus is driven for a long time. To effectively dissipate the heat generated by the PDP, a heat dissipation unit may be installed between the PDP and the chassis base. The heat dissipation unit is generally attached to the rear surface of the PDP to receive and dissipate heat generated by the PDP.

However, the heat dissipation unit may be formed of a material has a high thermal conductivity but releases debris. When the conductive debris of the heat dissipation unit are introduced into a place such as where circuits are formed, a short circuit can occur. In addition, the conductive debris contaminates the circuit units on the PDP. Thus, the durability of the plasma display apparatus can decrease, or the display performance of the PDP can degrade.

Meanwhile, when the PDP is driven for long periods of time under poor conditions, the adhesion of the heat dissipation unit to the PDP can weaken. When this happens, the dissipation performance of the heat dissipation unit can degrade, and noise can occur due to vibrations between the PDP and the heat dissipation unit. Therefore, what is needed is an improved design for a plasma display apparatus and an improved design for a heat dissipation unit that overcomes these problems.

SUMMARY OF THE INVENTION

It is therefore an object of the present invention to provide an improved design for a plasma display apparatus.

It is also an object of the present invention to provide a design for a plasma display apparatus that effectively dissipates heat while preventing the generation of debris or particulates.

It is further an object of the present invention to provide a design for a plasma display apparatus where the adhesion of the heat dissipation unit to the display panel does not degrade over time.

It is yet an object of the present invention to provide a design for a plasma display apparatus where the performance of the heat dissipation unit is less apt to degrade throughout the life of the display.

These and other objects can be achieved by a plasma display apparatus that includes a plasma display panel adapted to display an image, a chassis base arranged at a rear of the plasma display panel, a circuit unit arranged on the chassis base and adapted to drive the plasma display panel and a heat dissipation unit arranged between the plasma display panel and the chassis base, the heat dissipation unit includes a first heat dissipation element includes of a material that produces debris, a first heat dissipation element arranged parallel to both the plasma display panel and the chassis base and adapted to dissipate heat generated by the plasma display panel and a second heat dissipation element covering at least a portion of the first heat dissipation element and being adapted to prevent debris from being released from the first heat dissipation element.

The first heat dissipation element can be attached to a rear surface of the plasma display panel. The second heat dissipation element can be arranged to cover an entire rear side of the first heat dissipation element. The second heat dissipation element can further extend from lateral surfaces of the first heat dissipation element to contact the rear surface of the plasma display panel. The second heat dissipation element can be thinner than the first heat dissipation element. The plasma display apparatus can further include an adhesive material adapted to attach the first heat dissipation element to the plasma display panel. The heat dissipation unit can be spaced apart from the chassis base. The first heat dissipation element can include a graphite-kind of material, and the second heat dissipation element can include a metal-kind of material. The first heat dissipation element can include a graphite-kind of material, and wherein the second heat dissipation element can include a pyrolitic carbon film produced by a process comprising coating the first heat dissipation element with pyrolitic carbon. The second heat dissipation element can be a thin sheet, the second heat dissipation element can be attached to the first heat dissipation element by an adhesive layer arranged on the first heat dissipation element.

According to another aspect of the present invention, there is provided a plasma display apparatus that includes a plasma display panel adapted to display an image, a chassis base arranged at a rear of the plasma display panel, a circuit unit arranged on the chassis base and adapted to drive the plasma display panel and a heat dissipation unit arranged between the plasma display panel and the chassis base, the heat dissipation unit including a first heat dissipation element that comprises a graphite-kind of material and arranged parallel to both the plasma display panel and the chassis base and a second heat dissipation element covering at least a portion of the first heat dissipation element.

The first heat dissipation element can be attached to the plasma display panel, and the second heat dissipation element can covers an entire rear side of the first heat dissipation element. The second heat dissipation element can further extend from lateral surfaces of the first heat dissipation element to contact the rear surface of the plasma display panel.

The second heat dissipation element can be thinner than the first heat dissipation element. The second heat dissipation element can include a pyrolitic carbon film and can be produced by a process comprising coating the first heat dissipation element with pyrolitic carbon. The second heat dissipation element can be a thin sheet and can be attached to the first heat dissipation element by an adhesive layer arranged on the first heat dissipation element.

According to yet another aspect of the present invention, there is provided a plasma display apparatus that includes a plasma display panel adapted to display an image, a chassis base arranged at a rear of the plasma display panel, a circuit unit arranged on the chassis base and adapted to drive the plasma display panel and a first heat dissipation element comprising a first material and arranged on the plasma display panel and a second heat dissipation element comprising a second and different is material and covering the first heat dissipation element and being adapted to prevent debris from being released from the first heat dissipation element.

The second heat dissipation element can be thinner than the first heat dissipation element. The second heat dissipation element can contact the plasma display panel around a periphery of the first heat dissipation element. The first material can be a graphite material of a high thermal conductivity, the second material can be a material that does not release debris during a life of the plasma display apparatus.

BRIEF DESCRIPTION OF THE DRAWINGS

A more complete appreciation of the invention and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
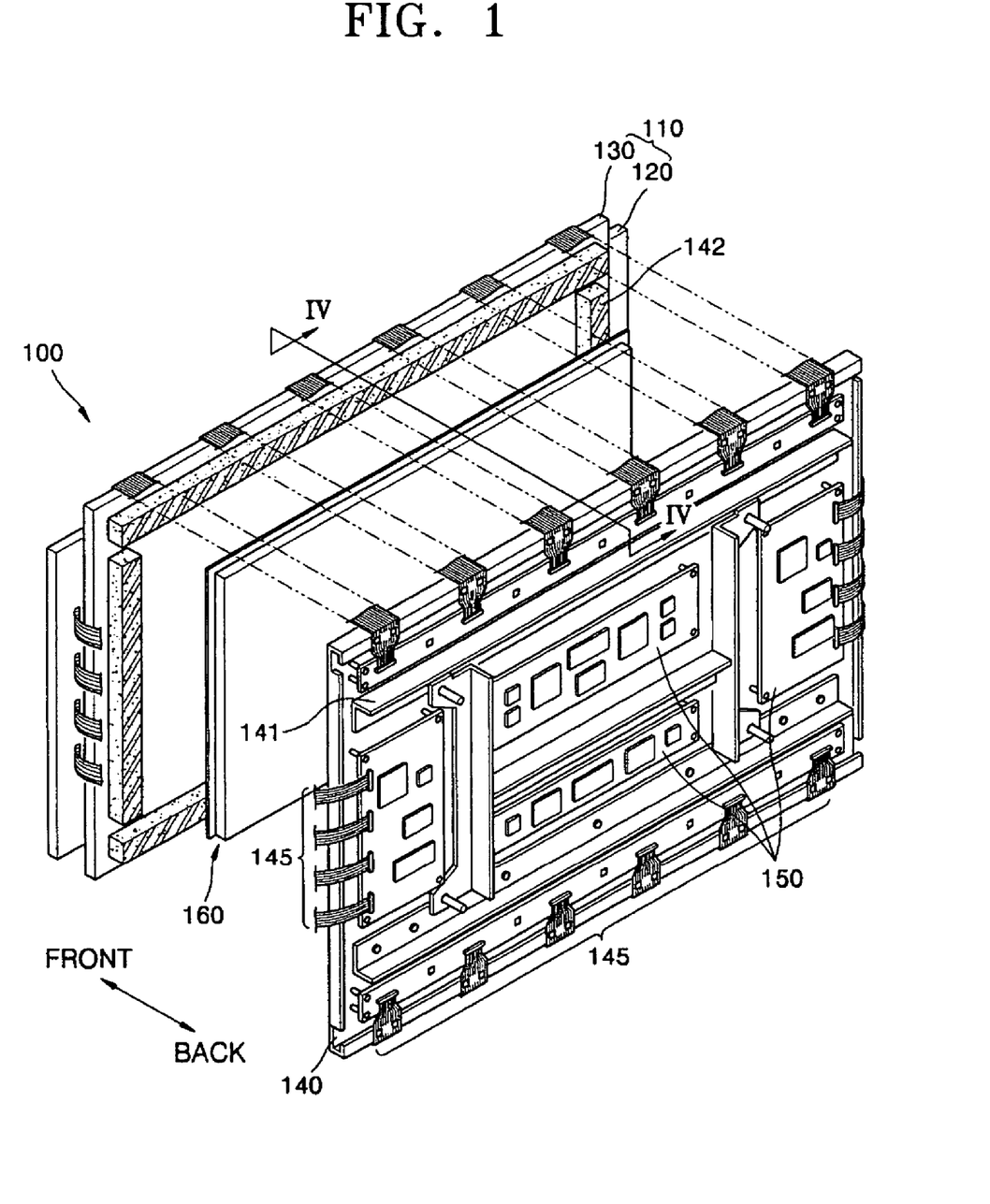
FIG. 1 is an exploded perspective view of a plasma display apparatus according to a first embodiment of the present invention.

Referring now to FIG. 1, FIG. 1 illustrates a plasma display apparatus 100 according to a first embodiment of the present invention. The plasma display apparatus 100 of FIG. 1 includes a plasma display panel (PDP) 110, a chassis base 140, and circuit units 150. The PDP 110 can be any of various types of PDPs that display images using a gas discharge phenomenon. For example, a surface-discharge three-electrode alternating current (AC) PDP as illustrated in FIG. 2 can be used as the PDP 110.

Figure 2:
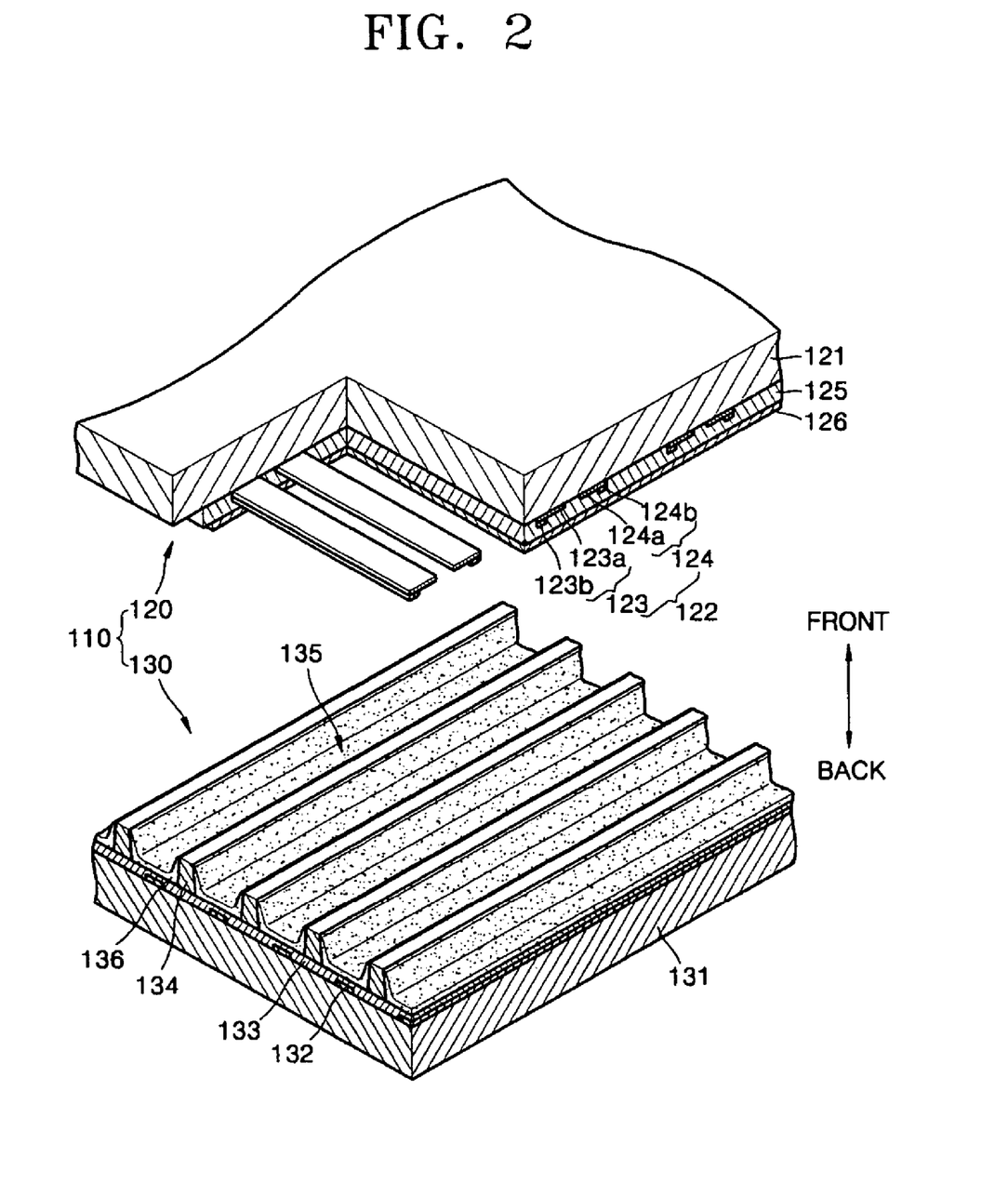
FIG. 2 is an exploded perspective view of the plasma display panel (PDP) of the plasma display apparatus of FIG. 1.

Turning now to FIG. 2, the PDP 110 of FIG. 2 includes a front panel 120 and a rear panel 130 facing the front panel 120. The front panel 120 includes a front substrate 121 and sustain electrode pairs 122 formed on a rear surface of the front substrate 121. The sustain electrode pairs 122 include an X electrode 123 and a Y electrode 124. A front dielectric layer 125 covers the sustain electrode pairs 122, and a protective layer 126 is formed on the rear surface of the dielectric layer 125 to cover the dielectric layer 125. The X electrodes 123 and the Y electrodes 124 of the sustain electrode pairs 122 serve as common electrodes and scan electrodes, respectively and are arranged to form discharge gaps therebetween. The X electrodes 123 include X transparent electrodes 123a and X bus electrodes 123b arranged to contact the X transparent electrodes 123a. Similarly, the Y electrodes 124 include Y transparent electrodes 124a and Y bus electrodes 124b arranged to contact the Y transparent electrodes 124a.

The rear panel 130 includes a rear substrate 131, address electrodes 132 formed on the front surface of the rear substrate 131 and extending in a direction perpendicular to a direction in which the sustain electrode pairs 122 extend, and a rear dielectric layer 133 covering the address electrodes 132. Barrier ribs 134 are formed on the rear dielectric layer 133 and define discharge spaces 135. Phosphor layers 136 are formed in the discharge spaces 135, and discharge gas fills the discharge spaces 135. The barrier ribs 134 are arranged so that at least one address electrode 132 is located between adjacent barrier ribs 134 and that the barrier ribs 134 extend parallel to the address electrodes 132. Each discharge space 135 marks a location where an electrode of the sustain electrode pair 122 and an address electrode 132 oppose each other. Although the barrier ribs 134 are illustrated to be arranged in a striped pattern, they can instead be arranged in other patterns such as a matrix pattern.

Referring back to FIG. 1, the chassis base 140 is disposed at the rear side of the PDP 110. The chassis base 140 can be made out of a metal such as aluminum. The chassis base 140 supports the PDP 110 and receives and dissipates heat generated by the PDP 110. As illustrated in FIG. 1, the chassis base 140 can have upper, lower, and side edges bent in the direction away from the PDP to prevent deformation. Reinforcing members 141 can also be installed on the rear side of the chassis base 140.

The chassis base 140 and the PDP 110 can be attached to each other by an adhesive member 142, such as double-sided tape. In other words, the adhesive members 142 are formed in strips and arranged between the chassis base 140 and the PDP 110 along the edges of the chassis base 140 and the PDP 110. One side of each of the adhesive members 142 is attached to the chassis base 140 and the other side thereof is attached to the PDP 110 so that the chassis base 140 and the PDP 110 are coupled to each other.

The circuit units 150, each including a plurality of various electrical elements, are arranged on the rear surface of the chassis base 140. Electrical signals generated by the circuit units 150 are transferred to the PDP 110 by a signal transfer member 145. The signal transfer member 145 can be at least one of a flexible printed cable, a tape carrier package, a chip on film, etc.

Figure 3:
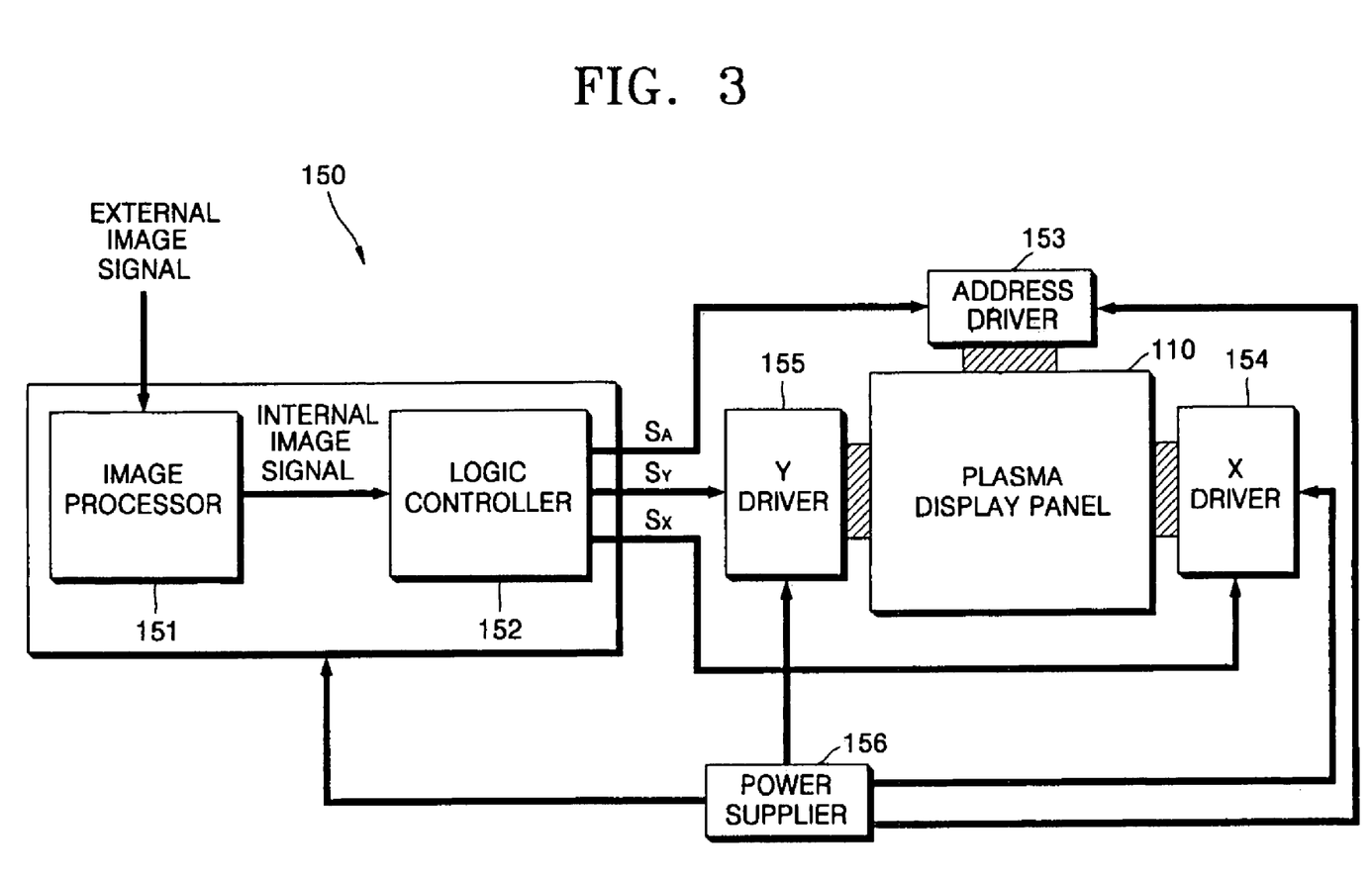
FIG. 3 is a block diagram of the circuit units of the plasma display apparatus of FIG. 1.

As shown in FIG. 3, each of the circuit units 150 can include an image processor 151, a logic controller 152, an address driver 153, an X driver 154, a Y driver 155, and a power supplier 156. The image processor 151 converts an external analog image signal into a digital signal to generate internal image signals, such as, red, green, and blue image data of 8 bits for each, a clock signal, and vertical and horizontal synchronization signals. The logic controller 152 generates driving control signals $S_A$, $S_Y$, and $S_X$ according to the internal image signals received from the image processor 151. The address driver 153 processes the driving control signal $S_A$, generates a display data signal, and applies the same to the address electrodes 132. The X driver 154 processes the driving control signal $S_X$ and applies a result of the processing to the X electrodes 123. The Y driver 155 processes the driving control signal $S_Y$ and applies a result of the processing to the Y electrodes 124. The power supplier 156 generates an operating voltage required by the image processor 151 and the logic controller 152, the address driver 153, the X driver 154, and the Y driver 155 and supplies the operating voltages to them. The circuit units 150 are accommodated together with the PDP 110 and the chassis base 140 in a case (not shown), thus forming the plasma display apparatus 100.

Figure 4:
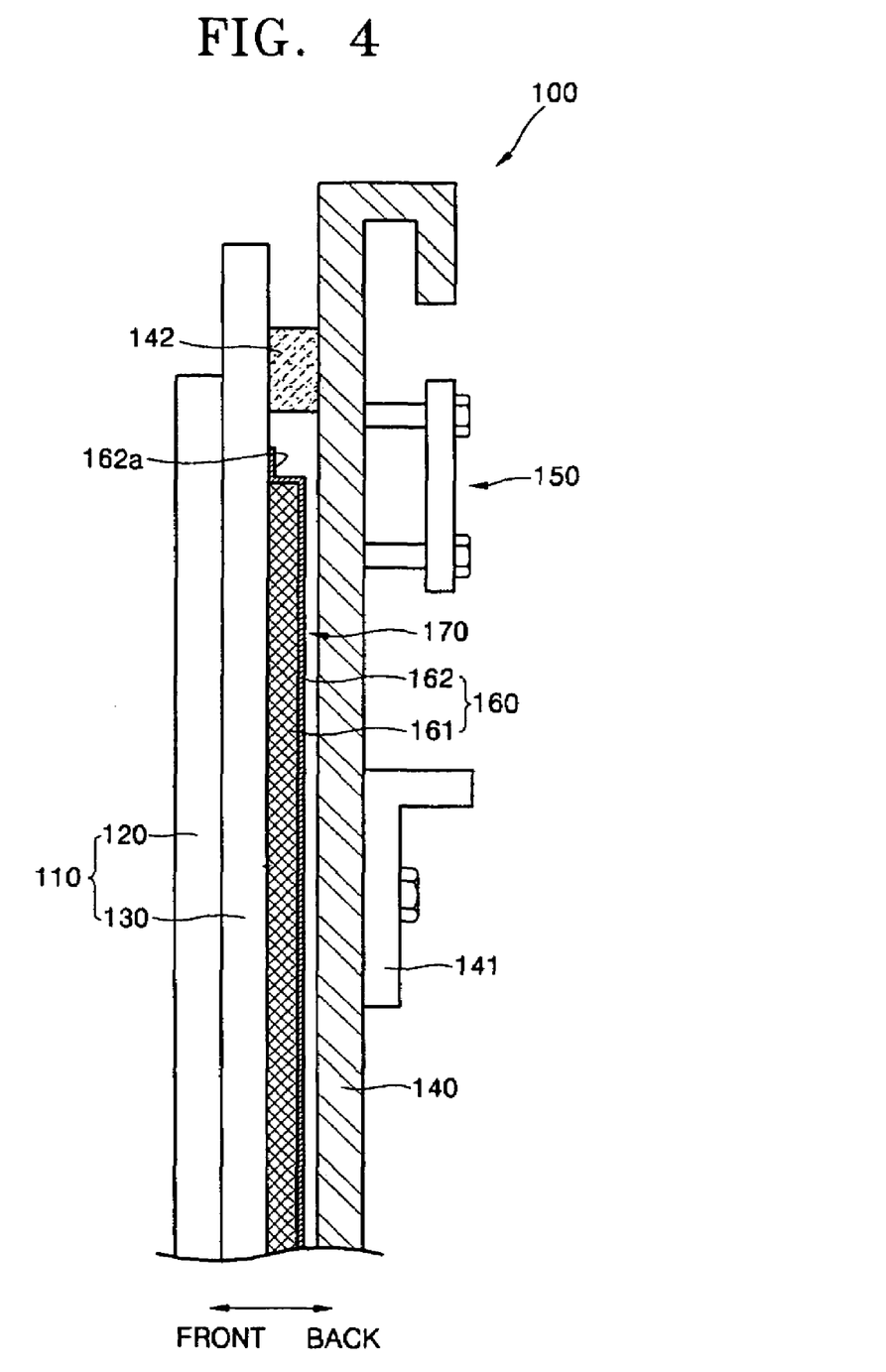
FIG. 4 is a cross-sectional view of FIG. 1 taken along line IV-IV of FIG. 1.
Figure 5:
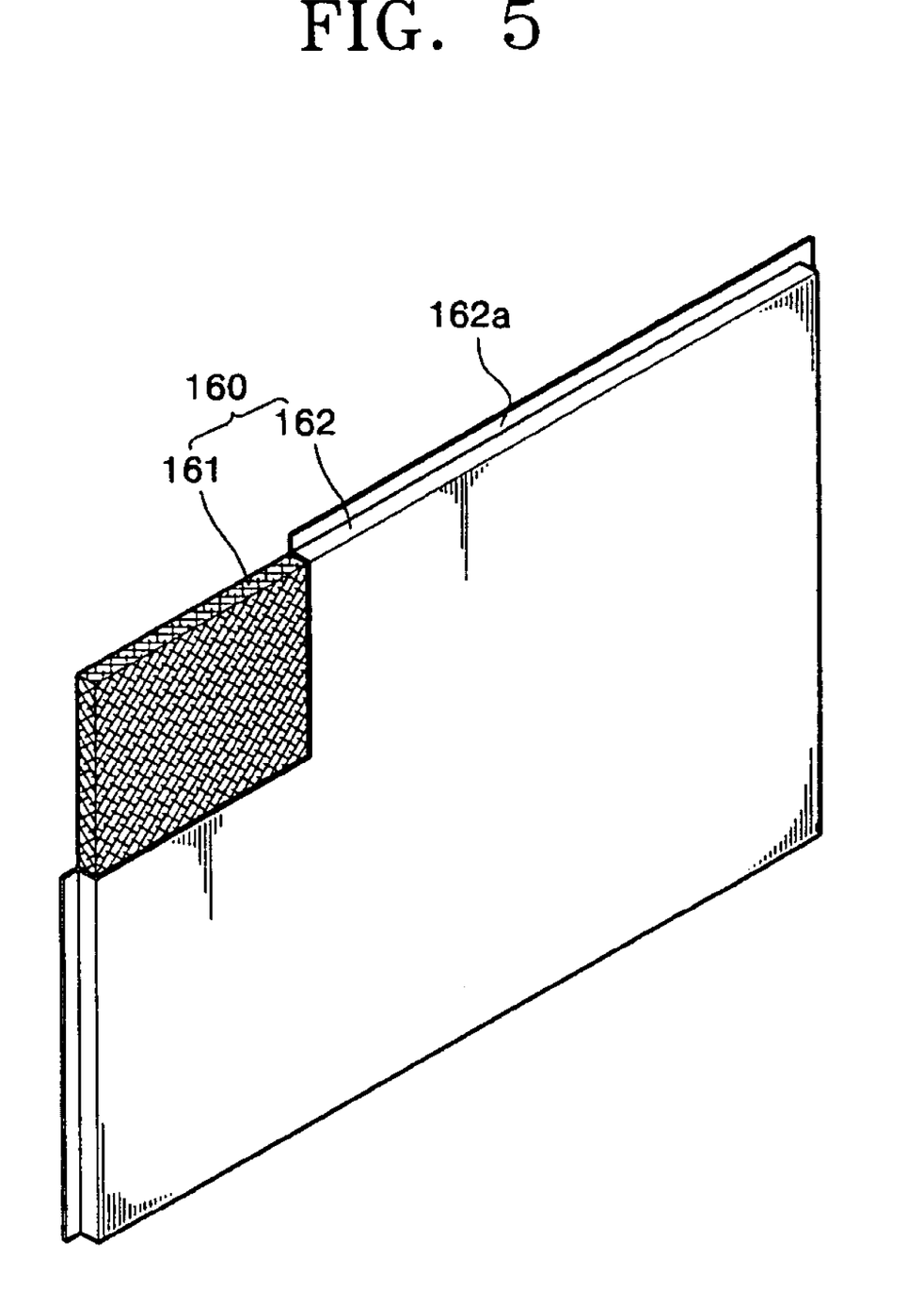
FIG. 5 is a perspective view of the heat dissipation unit of the plasma display apparatus of FIG. 1.

According to the present invention, a heat dissipation unit 160 is interposed between the chassis base 140 and the PDP 110. Referring to FIGS. 4 and 5, the heat dissipation unit 160 includes a first heat dissipation element 161 and a second heat dissipation element 162 that covers at least a portion of the first heat dissipation element 161.

The first heat dissipation element 161 is located within a space defined by the adhesive members 142 between the PDP 110 and the chassis base 140, and has the shape of a plate and is parallel to the PDP 110 and the chassis base 140. The first heat dissipation element 161 can be wide to the point that the edges of the first heat dissipation element 161 can be close to the adhesive members 142 to secure a sufficient dissipation area. However, the present invention is not limited to this arrangement.

The first heat dissipation element 161 is formed of a high thermally conductive material, such as a graphite-kind of material. As illustrated in FIG. 4, the first heat dissipation element 161 can be installed on the rear surface of the PDP 110. Here, the graphite used for the first heat dissipation element 161 has a crystal structure into which an amorphous carbon structure is transformed when baked in an electrical resist furnace between 2500 and 3000° C.

The first heat dissipation element 161 and the PDP 110 can be attached to each other by an adhesive material formed entirely on a surface of the PDP 110 that faces the first heat dissipation element 161. The first heat dissipation element 161 formed in this way receives the heat generated by the PDP 110 during operation and rapidly spreads the heat in a direction parallel to the surface of the PDP 110. Accordingly, the heat distribution can be more uniform over the PDP 110 so that image retention due to degradation of the phosphor layers 136 (see FIG. 2) caused by local accumulation of heat can be reduced.

The first heat dissipation element 161 can be made of a material that can release debris, such as a kind of graphite. A second heat dissipation element 162 is added to cover the first heat dissipation element 161 preventing debris and particulates from the first heat dissipation element 161 from escaping. As a result, the second heat dissipation element 162 prevents debris from the first heat dissipation element 161 from contaminating the rest of the plasma display apparatus 100 and short circuiting the circuit units 150.

As illustrated in FIG. 5, the second heat dissipation element 162 can be formed to cover the entire rear surface of the first heat dissipation element 161. The second heat dissipation element 162 can be made of a metal-kind of material that does not generate debris and can receive the heat from the first heat dissipation element 161 and smoothly dissipate the heat by thermal exchange with the ambient air. The second heat dissipation element 162 is preferably a thin film having a smaller thickness than that of the first heat dissipation element 161 in order to minimize a degrading of the heat dissipation performance of the first heat dissipation element 161. However, the present invention is not limited to such dimensions for the second heat dissipation element 162.

When the first heat dissipation element 161 is formed of a material that can release debris such as a graphite-kind of material, the second heat dissipation element 162 can be formed during the manufacture of the plasma display apparatus 100 to prevent the debris from the first heat dissipation element 161 from being released. In other words, in the present embodiment, the second heat dissipation element 162 can be a pyrolytic carbon film formed by coating the first heat dissipation element 161 with pyrolytic carbon. The pyrolytic carbon is coated using a pyrolytic carbon (Pyc) coating technique in which pyrolytic carbon is turned into a thin film by chemical vapor deposition (CVD). By forming the second heat dissipation element 162 of a pyrolytic carbon film on the first heat dissipation element 161, no debris is produced when the first dissipation element 161 is installed between the PDP 110 and the chassis base 140. Hence, the degradation in the durability of a plasma display apparatus 100 due to debris contaminating the circuit units 150 or the PDP 110 can be prevented.

As illustrated in FIG. 5, the second heat dissipation element 162 can be formed to cover not only the rear surface but also to cover the lateral surfaces of the first heat dissipation element 161 and to further extend from the lateral surfaces by having an extension portion 162a that contacts the rear surface of the PDP 110. The extension portion 162a of the second heat dissipation element 162 is attached to the rear surface of the PDP 110 by an adhesive material.

By including the second heat dissipation element 162 as above, the attachment of the first heat dissipation element 161 to the PDP 110 can be kept more secure, and thus the attachment of the heat dissipation unit 160 to the PDP 110 is further improved. As a result, the heat generated by the PDP 110 can more smoothly be transferred to the first heat dissipation element 161 and dissipated therefrom. Because there is no gap between the PDP 110 and the heat dissipation element 160, noise due to vibration can be reduced. Further, because the second heat dissipation element 162 covers not only the rear surface but also the lateral surfaces of the first heat dissipation element 161, an outflow of debris from the lateral surfaces of the first dissipation element 161 can be prevented. Although the second heat dissipation element 162 in FIGS. 4 and 5 is illustrated as covering only the rear side of the first heat dissipation element 161, the second heat dissipation element 162 can be designed to entirely surround the first heat dissipation element 161.

As illustrated in FIG. 4, the heat dissipation unit 160 having such a structure can be spaced apart from the chassis base 140 by space 170. The space 170 can prevent heat generated by the circuit units 150 and traveling from the chassis base 140 to the PDP 110 or prevent heat generated by the PDP 110 and traveling from the heat dissipation unit 160 to the circuit units 150 via the chassis base 140.

Figure 6:
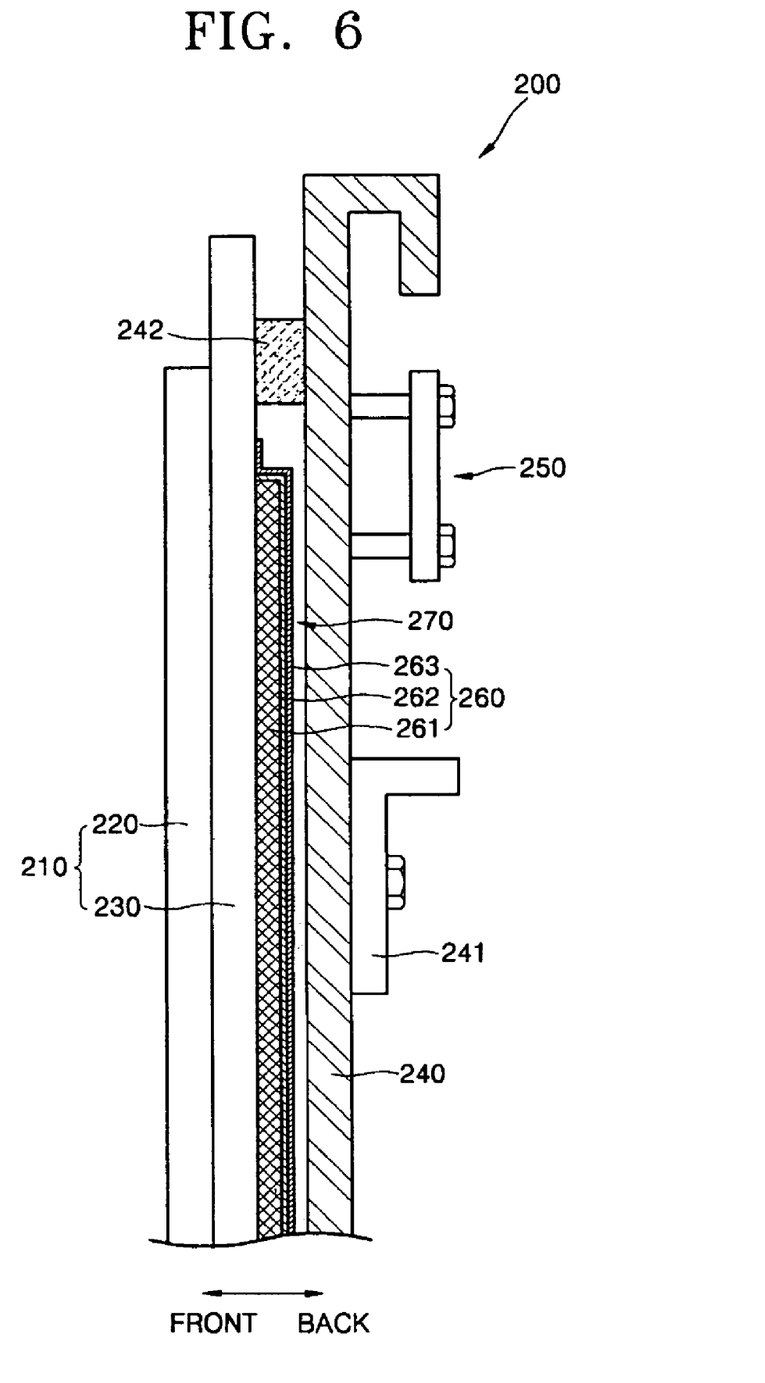
FIG. 6 is a cross-sectional view of a plasma display apparatus according to a second embodiment of the present invention.

Turning now to FIG. 6, FIG. 6 is a cross-sectional view of a plasma display apparatus 200 according to a second embodiment of the present invention. The plasma display apparatus 200 of FIG. 6 includes a PDP 210 having a front panel 220 and a rear panel 230, a chassis base 240, and a circuit unit 250. As illustrated in FIG. 6, adhesive members 242 and a heat dissipation unit 260 are disposed between the PDP 210 and the chassis base 240. Reinforcing members 241 are installed on the chassis base 240. As illustrated in FIG. 6, the heat dissipation unit 260 can be spaced apart from the chassis base 240 by space 270.

Referring to FIG. 6, the heat dissipation unit 260 can include a first heat dissipation element 261, an adhesive layer 262 coated on the first heat dissipation element 261, and a second heat dissipation element 263, which is a thin sheet contacting a surface of the adhesive layer 262. Second heat dissipation element 263 is attached to an opposite side of adhesive layer 262 than the side of adhesive layer 262 that contacts first heat dissipation element 261.

A plasma display apparatus according to the present invention includes an improved heat dissipation unit that can prevent the generation of debris. Thus, a short circuit due to introduction of debris into a circuit unit in a plasma display apparatus can be prevented. In addition, the heat dissipation unit of the plasma display apparatus is designed to improve adhesion to a plasma display panel (PDP). Thus, heat generated by the PDP can more effectively be transferred to the heat dissipation unit as there is no gap between the PDP and the heat dissipation unit, thus reducing noise due to vibration. Furthermore, generation of debris from the heat dissipation unit is prevented upon manufacturing of the plasma display apparatus. This leads to an increase in the durability of the plasma display apparatus and an improvement in the display performance of the plasma display apparatus.

While the present invention has been particularly shown and described with reference to exemplary embodiments thereof, it will be understood by those of ordinary skill in the art that various changes in form and details can be made therein without departing from the spirit and scope of the present invention as defined by the following claims.

What is claimed is:

1. A plasma display apparatus, comprising:
 a plasma display panel to display an image;
 a chassis base arranged at a rear of the plasma display panel;
 a circuit unit, arranged on the chassis base, to drive the plasma display panel; and
 a heat dissipation unit arranged between the plasma display panel and the chassis base, wherein the heat dissipation unit is directly spaced apart from the chassis base by a void, the heat dissipation unit comprising:
 a first heat dissipation element, arranged parallel to both the plasma display panel and the chassis base, to dissipate heat generated by the plasma display panel; and
 a second heat dissipation element, covering at least a portion of the first heat dissipation element, to prevent debris from being released from the first heat dissipation element.

2. The plasma display apparatus of claim 1, wherein the first heat dissipation element is attached to a rear surface of the plasma display panel.

3. The plasma display apparatus of claim 2, wherein the second heat dissipation element is arranged to cover an entire rear side of the first heat dissipation element.

4. The plasma display apparatus of claim 3, wherein the second heat dissipation element further includes an extension portion that extends from lateral surfaces of the first heat dissipation element to contact the rear surface of the plasma display panel, the extension portion of the second heat dissipation element being attached to the rear surface of the plasma display panel by an adhesive material.

5. The plasma display apparatus of claim 4, wherein the second heat dissipation element is thinner than the first heat dissipation element.

6. The plasma display apparatus of claim 2, further comprising an adhesive material to attach the first heat dissipation element to the plasma display panel.

7. The plasma display apparatus of claim 1, wherein the circuit unit is arranged directly on the chassis base.

8. The plasma display apparatus of claim 1, wherein the first heat dissipation element comprises a graphite-kind of material, and wherein the second heat dissipation element comprises a metal.

9. The plasma display apparatus of claim 1, wherein the first heat dissipation element comprises a graphite-kind of material, and wherein the second heat dissipation element comprises a pyrolytic carbon film produced by a process comprising coating the first heat dissipation element with pyrolytic carbon.

10. The plasma display apparatus of claim 1, the second heat dissipation element being a thin sheet, the second heat dissipation element being attached to the first heat dissipation element by an adhesive layer arranged on the first heat dissipation element.

11. A plasma display apparatus, comprising:
 a plasma display panel to display an image;
 a chassis base arranged at a rear of the plasma display panel;
 a circuit unit, arranged on the chassis base, to drive the plasma display panel; and
 a heat dissipation unit arranged between the plasma display panel and the chassis base, the heat dissipation unit being spaced apart from the chassis base by only a void, the heat dissipation unit comprising:
 a first heat dissipation element that comprises a graphite-kind of material and arranged parallel to both the plasma display panel and the chassis base; and
 a second heat dissipation element covering at least a portion of the first heat dissipation element, wherein the second heat dissipation element comprises a pyrolytic carbon film.

12. The plasma display apparatus of claim 11, wherein the first heat dissipation element is attached to the plasma display panel, and wherein the second heat dissipation element covers an entire rear side of the first heat dissipation element.

13. The plasma display apparatus of claim 12, wherein the second heat dissipation element further extends from lateral surfaces of the first heat dissipation element to contact the rear surface of the plasma display panel.

14. The plasma display apparatus of claim 13, wherein the second heat dissipation element is thinner than the first heat dissipation element.

15. The plasma display apparatus of claim 11, the void to prevent heat generated by the plasma display panel from reaching the chassis base and to prevent heat generated by the circuit unit from reaching the plasma display panel.

16. The plasma display apparatus of claim 11, wherein the second heat dissipation element is a thin sheet and is attached to the first heat dissipation element by an adhesive layer arranged on the first heat dissipation element.

17. A plasma display apparatus, comprising:
 a plasma display panel to display an image;
 a chassis base arranged at a rear of the plasma display panel;
 a circuit unit, arranged on the chassis base, to drive the plasma display panel;
 a first heat dissipation element comprising a first material and arranged on the plasma display panel; and
 a second heat dissipation element comprising a second and different material and covering the first heat dissipation element, the second heat dissipation element to prevent debris from being released from the first heat dissipation element, the second heat dissipation element being attached to the plasma display panel around a periphery of the first heat dissipation element by an adhesive material, the second heat dissipation element being spaced-apart from the chassis base by a single continuous void.

18. The plasma display apparatus of claim 17, the second heat dissipation element being thinner than the first heat dissipation element.

19. The plasma display apparatus of claim 17, the void to prevent the circuit unit arranged on the chassis base from heating the plasma display panel and to prevent the plasma display panel from heating the circuit unit arranged on the chassis base.

20. The plasma display apparatus of claim 17, the first material comprising a graphite material of a high thermal conductivity, the second material comprising a material that does not release debris during a life of the plasma display apparatus.

* * * * *